(12) United States Patent
Sekiguchi et al.

(10) Patent No.: US 9,018,672 B2
(45) Date of Patent: Apr. 28, 2015

(54) SEMICONDUCTOR DEVICE COMPRISING A SEMICONDUCTOR ELEMENT HAVING TWO ELECTRODES

(71) Applicant: Canon Kabushiki Kaisha, Tokyo (JP)

(72) Inventors: Ryota Sekiguchi, Tokyo (JP); Alexis Debray, Tokyo (JP); Yasushi Koyama, Kamakura (JP); Kosuke Asano, Utsunomiya (JP); Satoshi Yokoyama, Utsunomiya (JP); Atsushi Kemmochi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/080,921

(22) Filed: Nov. 15, 2013

(65) Prior Publication Data

US 2014/0145280 A1  May 29, 2014

(30) Foreign Application Priority Data

Nov. 26, 2012 (JP) ................................. 2012-257596
Oct. 9, 2013 (JP) ................................. 2013-212391

(51) Int. Cl.
*H01L 29/66* (2006.01)
*H01L 23/66* (2006.01)

(52) U.S. Cl.
CPC ......... *H01L 23/66* (2013.01); *H01L 2924/0002* (2013.01)

(58) Field of Classification Search
USPC .......................................... 257/104, 197, 476
See application file for complete search history.

(56) References Cited

U.S. PATENT DOCUMENTS

| | | | |
|---|---|---|---|
| 5,677,574 A | 10/1997 | Hisaka | 257/776 |
| 5,883,422 A | 3/1999 | Anand et al. | 257/471 |
| 8,025,074 B2 | 9/2011 | Debray | 137/74 |
| 2008/0160654 A1* | 7/2008 | Meyer et al. | 438/14 |
| 2010/0171219 A1* | 7/2010 | Moreau et al. | 257/751 |
| 2011/0204522 A1* | 8/2011 | Lee et al. | 257/770 |
| 2011/0316098 A1* | 12/2011 | Dunbar et al. | 257/415 |
| 2013/0065376 A1* | 3/2013 | Horak et al. | 438/381 |
| 2014/0226690 A1* | 8/2014 | Sherrer | 372/44.01 |

FOREIGN PATENT DOCUMENTS

| | | |
|---|---|---|
| JP | S63-122179 | 5/1988 |
| JP | H08-008340 | 1/1996 |
| JP | H08-288384 | 11/1996 |
| JP | H11-097530 | 4/1999 |
| JP | 2009-152617 | 7/2009 |

* cited by examiner

*Primary Examiner* — Ngan Ngo

(74) *Attorney, Agent, or Firm* — Fitzpatrick, Cella, Harper & Scinto

(57) ABSTRACT

Provided is a semiconductor device including: a semiconductor element arranged on a substrate and having two electrodes; a conductive strip in contact with one of the two electrodes; and a dielectric arranged between another one of the two electrodes and the conductive strip, in which the conductive strip has an opening formed therein, the dielectric has a void formed therein, and the opening and the void are connected to each other.

13 Claims, 8 Drawing Sheets

SEMICONDUCTOR DEVICE COMPRISING A SEMICONDUCTOR ELEMENT HAVING TWO ELECTRODES

BACKGROUND OF THE INVENTION

1. Field of the Invention

The present invention relates to a semiconductor device, and more specifically, to a device using a semiconductor element in a frequency band within a frequency region of a millimeter waveband to a terahertz waveband (30 GHz or more and 30 THz or less; hereinafter, which is used similarly), and a production method therefor.

2. Description of the Related Art

In recent years, the basic development of a semiconductor element such as the generation, amplification, and detection of an electromagnetic wave (hereinafter sometimes referred to as simply "terahertz wave") containing at least partial frequency component of a frequency band from a millimeter waveband to a terahertz waveband has been performed actively. This is because a terahertz wave has the following properties and is considered to be useful for industry. First, the terahertz wave passes through a nonmetallic substance like an X-ray. Second, absorption spectra peculiar to biological molecules and medical products are present in a great number in the frequency band of the terahertz wave. Third, the terahertz wave has a spatial resolution required for a great number of imaging applications. From the foregoing features, as application fields of the terahertz wave, a spectroscopic analysis technology for an inside of a substance, a safe transparent imaging device replacing an X-ray, an analysis technology for biological molecules and medical products, and the like have been considered.

As a basic semiconductor element in the above-mentioned frequency region, one method is to consider an electronic device as an approach from a millimeter waveband. Known examples of the electronic device are basic semiconductor elements such as a negative resistive element for generating an electromagnetic wave, a transistor using a heterojunction for amplifying an electromagnetic wave, and a rectifying element for detecting an electromagnetic wave.

In a device using the above-mentioned semiconductor element, the presence of unintended parasitic reactance and parasitic resistance which remarkably degrade the performance on a high frequency side is one of problems. The factor for causing this problem is wiring. The parasitic electric delay caused by stray capacitance $C_s$ in wiring up to the semiconductor element and series resistance $R_s$ thereof needs to be small. Therefore, in general, the electric delay is reduced by miniaturizing the wiring and element layout. However, there is a limit to such a method, and hence the following method has hitherto been considered.

Japanese Patent Application Laid-Open No. 2009-152617 discloses a semiconductor device using a low-permittivity material called benzocyclobutene (BCB) having a specific permittivity of about 2 to 3 in a device using a Schottky barrier diode for a microwave and a millimeter wave. The semiconductor device disclosed in Japanese Patent Application Laid-Open No. 2009-152617 has a structure in which the stray capacitance $C_s$ parasitic in wiring is suppressed to reduce an electric delay ($R_s C_s$). Further, Japanese Patent Application Laid-Open No. S63-122179 discloses a semiconductor device in which wiring up to a semiconductor element is bridged in a hollow, and the air (or inactive gas) having a specific permittivity of about 1 is used in the hollow portion. In such a structure, the stray capacitance $C_s$ can be further suppressed although there is concern about electric connection at an inter-element level.

However, in Japanese Patent Application Laid-Open No. 2009-152617, there is a limit to the reduction in parasitic capacitance because a dielectric having a specific permittivity which is low but still larger than that of air is used. In Japanese Patent Application Laid-Open No. S63-122179, the semiconductor device has a structure in which the mechanical strength is industrially unstable as in yield of hollow wiring.

SUMMARY OF THE INVENTION

A semiconductor device according to one embodiment of the present invention includes: a semiconductor element arranged on a substrate and having two electrodes; a conductive strip in contact with one of the two electrodes; and a dielectric arranged between another one of the two electrodes and the conductive strip, in which the conductive strip has an opening formed therein, the dielectric has a void formed therein, and the opening and the void are connected to each other.

Further features of the present invention will become apparent from the following description of exemplary embodiments with reference to the attached drawings.

DESCRIPTION OF THE EMBODIMENTS

In terms of the structure of a semiconductor element, immediately below conductive strip leading to one electrode of the semiconductor element, another electrode or a site having the same potential as that of another electrode of the semiconductor element is formed in many cases. Therefore, the present invention is mainly directed to stabilizing mechanical strength while reducing parasitic capacitance of a semiconductor device. Even when a structure of only this part is improved, the parasitic electric delay caused by the stray capacitance $C_s$ in wiring up to the semiconductor element and the series resistance $R_s$ thereof can be reduced effectively. The inventors of the present invention found that, when an opening is formed in the strip and a void is provided in a portion immediately below the opening, the parasitic capacitance can be reduced, and the mechanical strength can also be stabilized if the opening in the conductive strip for providing the void is small.

Embodiments of the present invention are hereinafter described with reference to the drawings.

First Embodiment

Figure 1A:
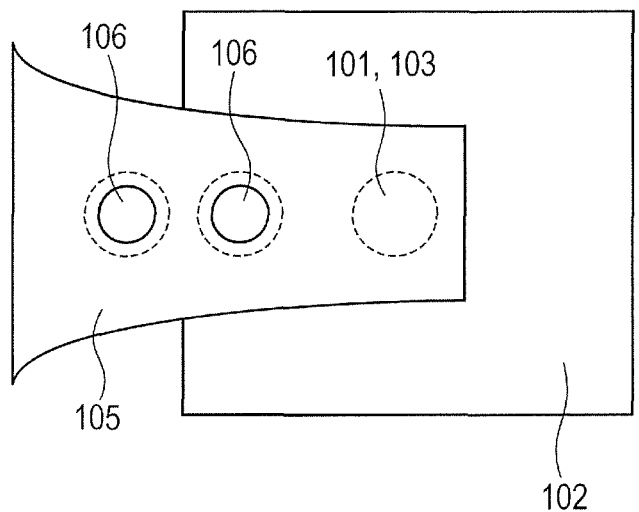
FIG. 1A is a view illustrating a configuration of a semiconductor device according to a first embodiment of the present invention.
Figure 1B:
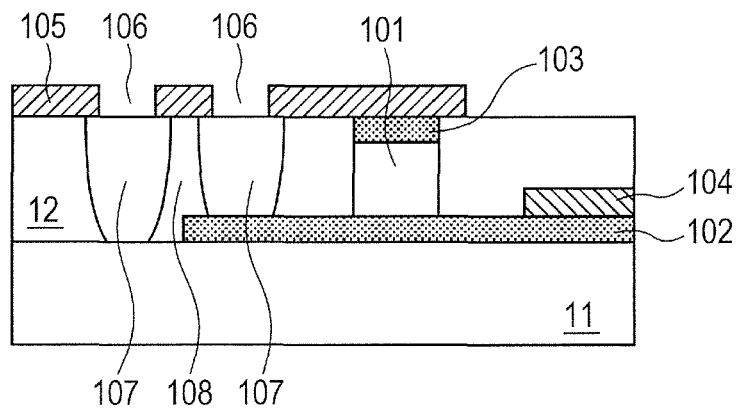
FIG. 1B is a view illustrating a configuration of the semiconductor device according to the first embodiment of the present invention.

A semiconductor device according to a first embodiment of the present invention is described with reference to FIGS. 1A and 1B. FIGS. 1A and 1B are schematic views illustrating the semiconductor device according to the first embodiment. FIG. 1A is a top view, and FIG. 1B is a sectional view. In the first embodiment, a semiconductor element 101 on a substrate having at least two electrodes is formed of a basic semiconductor element in a range of a millimeter waveband to a terahertz waveband. Examples of the semiconductor element include a Schottky barrier diode serving as a detecting element, a rectifying element such as a planar doped barrier diode, a resonant tunneling diode (RTD) or an Esaki diode serving as a generation element, a negative resistive element such as a gunn diode, and a three-terminal element of a heterojunction bipolar transistor (HBT) serving as an amplifying element. Those elements are electronic devices, and the semiconductor element 101 includes electrodes. A collector 102 and an emitter 103 are provided and generally formed of a conductive semiconductor doped with charge carriers. Further, conductive strip 104 made of a metal on a collector electrode side is connected to the collector 102, and conductive strip 105 made of a metal on an emitter electrode side is connected to the emitter 103. The conductive strips 104 and 105 are provided so as to extract the electric characteristics of the semiconductor element 101.

The semiconductor element 101 of this embodiment has vertical layout. In order to insulate the emitter electrode (emitter 103, strip 105) from the collector electrode (collector 102, strip 104), a dielectric 12 serving as an insulator is generally arranged between the emitter electrode and the collector electrode. Then, in the above-mentioned device configuration in which one electrode is provided immediately above the dielectric 12, stray capacitance $C_s$ which bypasses a region between the emitter electrode and the collector electrode through the dielectric 12 occurs without fail. The stray capacitance $C_s$ mainly occurs in a portion where the emitter electrode and the collector electrode are opposed to each other in the vicinity of a side wall of the semiconductor element 101. This portion corresponds to the one between the strip 105 and the conductive collector 102 illustrated in FIG. 1B. The strip 105 and the collector 102 are processed so as to be integrated with the semiconductor element 101 as a structure on the substrate 11. Therefore, for example, even when the strip 105 and the collector 102 are processed with good accuracy through use of photolithography, an overlapping region of about positioning accuracy is present. In FIG. 1B, the portion described above is emphasized. Even when it is assumed that the overlapping region has a size of 10 $\mu m^2$ and the dielectric 12 has a specific permittivity of about 4 (for example, the dielectric 12 is made of a silicon oxide film), if the distance between the strip 105 and the collector 102 is 100 nm, stray capacitance $C_s$ of about 3.5 fF is at least present. The stray capacitance $C_s$ of about 3.5 fF is not so small. If it is assumed that wiring resistance $R_s$ is 10Ω in this case, electric delay $R_s \times C_s$ becomes 35 femtoseconds. This electric delay corresponds to 4.5 THz when converted into a cut-off frequency as a primary filter, and the electric characteristics of the semiconductor element 101 cannot be extracted at a frequency higher than 4.5 THz. Further, actually, a filter is formed in some cases by involving inductance components of the wirings 104 and 105 and the semiconductor element 101, and the cut-off frequency in this case becomes lower. Therefore, it is considered that non-negligible parasitic capacitance is present in a frequency region from a millimeter waveband to a terahertz waveband.

A structure for reducing the parasitic capacitance is a void 107 illustrated in FIG. 1B. The void 107 is provided in the dielectric 12 including a portion between the strip 105 and the collector 102, and serves to lower the effective specific permittivity effectively. It is preferred that the void 107 be formed so as to extend from the strip 105 to the collector 102. In this embodiment, there are two voids 107, and a support portion 108 formed of the remaining dielectric 12 between them mechanically supports the strip 105 immediately above the support portion 108, with the result that mechanical stability is obtained. The void 107 is connected to an opening 106 of the strip 105 and is produced by removing the dielectric 12 after forming the opening 106. As a result, the void 107 has the structure illustrated in FIG. 1B. The wiring resistance increased by the opening 106 which is sufficiently smaller than the width of the strip 105 is almost negligible. For example, if it is assumed that one opening having a diameter of 1 μm is formed in a typical metal having a width of 5 μm and a thickness of 100 nm, an increase in wiring resistance is at most several mΩ. Thus, in the above-mentioned structure, it is relatively difficult to increase the wiring resistance, and hence the structure has an effect in that a reduction in effective permittivity almost directly reduces electric delay. Although depending on the structure, the effective permittivity takes a value between the specific permittivity $\in_{12}$ of an original material for the dielectric 12 and the specific permittivity of a medium filling the void 107. Thus, it is appropriate that the medium is inactive gas or air having a specific permittivity of about 1. Further, it is preferred that the void 107 having a larger area than that of the opening 106 be provided as shown in this embodiment, because the effective specific permittivity can be reduced. In this embodiment, the strip 105 overhangs the void 107. It is preferred that the size of the void 107 be larger than the size of the opening 106 and 100 μm or less from the viewpoint of the mechanical strength, although depending on the structure. Needless to say, the strip 105 is not limited to a metal, and the same effects can be achieved even when the strip 105 is made of polysilicon or the like. The void 107 can be produced through use of chemical etching (or etching which has strong chemical properties) of the dielectric 12 through the opening 106 formed in advance. This is because, when the chemical etching is used, side etching is performed easily, and the void 107 can be formed to be larger than the opening 106. Note that, the "size of the opening" as used herein refers to the length of the opening in an in-plane direction of the substrate 11, and is specifically defined to be the length of the longest line segment in line segments each connecting both ends of the opening. For example, in the case where the cross-section of the opening in the in-plane direction of the substrate 11 has a circular shape, the "size of the opening" is equal to the opening diameter. Further, similarly, the "size of the void" as used herein refers to the length of the void in the in-plane direction of the substrate 11, and is specifically defined to be the length of the longest line segment in line segments each connecting both ends of the void. For example, in the case where the cross-section of the void in the in-plane direction of the substrate 11 has a circular shape, the "size of the void" is equal to the void diameter. Further, the "area of the opening" as used herein refers to the area of a cross-section of the opening in the in-plane direction of the substrate 11, and the "area of the void" as used herein refers to the maximum area of a cross-section of the void in the in-plane direction of the substrate 11.

Figure 2A:
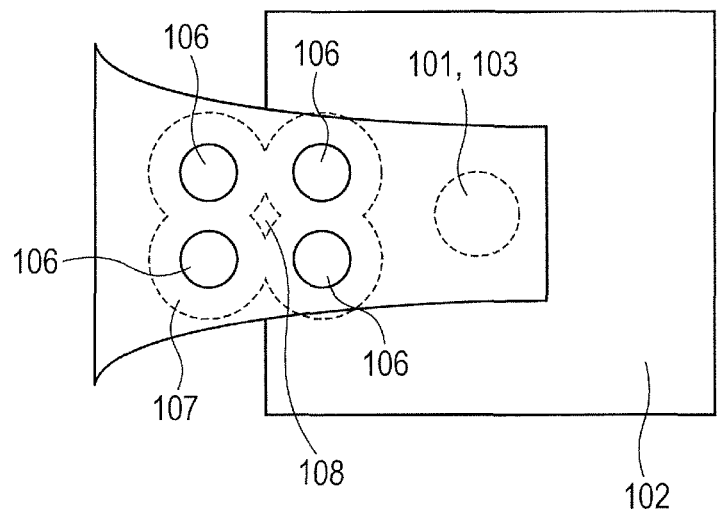
FIG. 2A is a view illustrating a configuration of a semiconductor device according to a modified example of the first embodiment of the present invention.
Figure 2B:
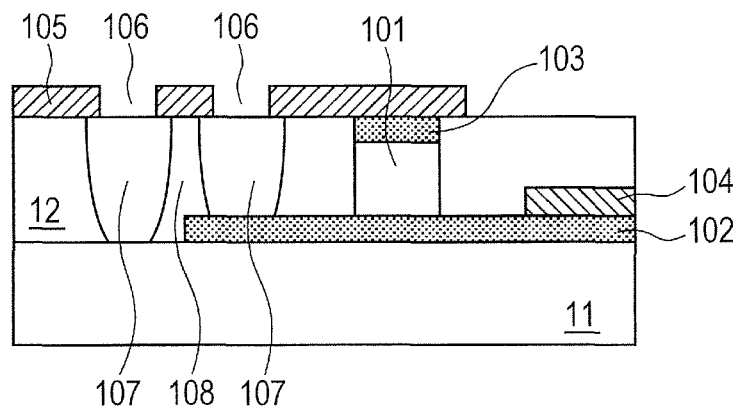
FIG. 2B is a view illustrating a configuration of the semiconductor device according to the modified example of the first embodiment of the present invention.

The number of the voids 107 is not limited to two. As a modified example of this embodiment, four voids 107 may be provided. FIGS. 2A and 2B illustrate an example in which there are four voids 107. As illustrated in FIG. 2A, when the size of the void 107 is larger than that of the opening 106 and is about the width of the strip 105, the support portion 108 of the dielectric 12 becomes an isolated dielectric pillar 108. In this case, the parasitic capacitance can be further reduced compared to the structure illustrated in FIGS. 1A and 1B. As described above, as a region of the void 107 below the strip 105 is larger, the parasitic capacitance can be reduced further, and in the structure of this embodiment, the mechanical strength can also be ensured. In this case, the strip 105 is supported by three points: the semiconductor element 101, the dielectric pillar 108, and the dielectric 12, and thus, a so-called continuous beam structure may be achieved. As is known in the field of the structural dynamics, the continuous beam supported by multiple points is stable in terms of structure, compared to a simple beam supported by two points. From a formula of a simple beam of a uniformly-distributed load, the maximum amount of deflection of the strip 105 is 5 $wL^4/384EI$ (w represents an own weight of strip per unit length; L represents a length of strip on the void 107; EI represents bending rigidity; E represents Young's modulus; I represents a cross-section secondary moment), and hence the maximum amount of deflection can be reduced to $1/16$ merely by adjusting the position of the third point dielectric pillar 108 to halve the length L of the strip on the void 107. In this embodiment, the dielectric pillar 108 can be set at any place. Therefore, the mechanical deformation of the strip 105 can be designed to be minimized, and the mechanical strength is more stable than that of the structure of the conventional hollow wiring.

The wiring 104 and 105 may be connected to other elements on the substrate 11, and hence the electric connection at an inter-element level on the substrate 11 is achieved easily. Thus, semiconductor elements in a frequency region from a millimeter waveband to a terahertz waveband can be easily integrated at a wafer level.

Second Embodiment

Figure 3A:
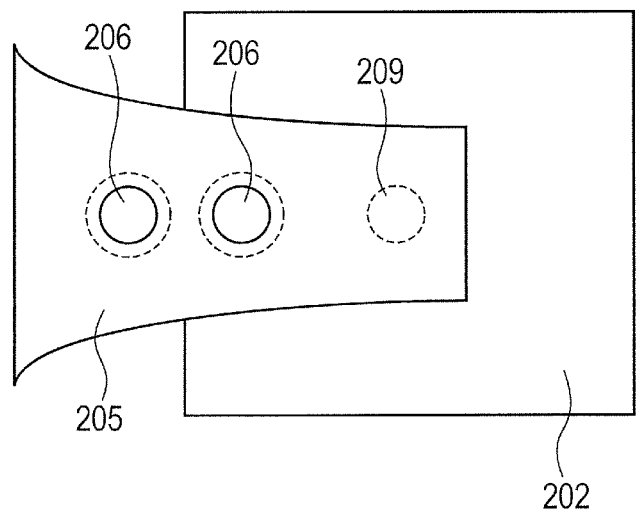
FIG. 3A is a view illustrating a configuration of a semiconductor device using a Schottky barrier diode according to a second embodiment of the present invention.
Figure 3B:
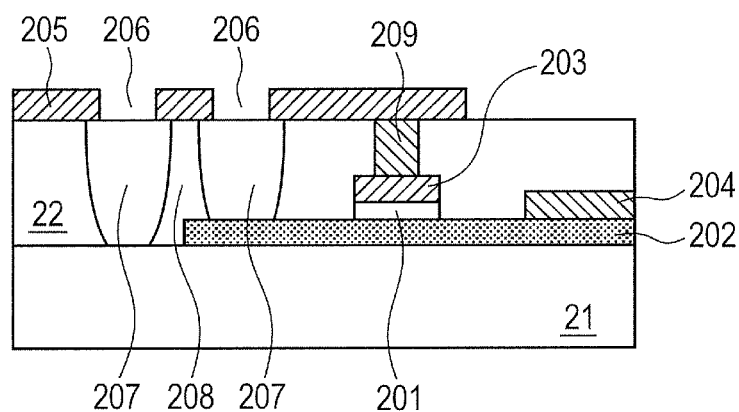
FIG. 3B is a view illustrating a configuration of the semiconductor device using the Schottky barrier diode according to the second embodiment of the present invention.

A semiconductor device according to a second embodiment of the present invention is described with reference to FIGS. 3A and 3B. FIGS. 3A and 3B are schematic views illustrating the semiconductor device according to the second embodiment. FIG. 3A is a top view, and FIG. 3B is a sectional view. This embodiment is a modified example of the first embodiment, and a Schottky barrier diode 201 is provided. A high-concentration carrier doped layer 202 and a low-concentration carrier doped layer to be the Schottky barrier diode 201, which has less carriers than the high-concentration carrier doped layer 202, are laminated from a substrate 21 side. A Schottky metal 203 is further laminated on the low-concentration carrier doped layer, with the result that a barrier layer is formed in the low-concentration carrier doped layer on the Schottky metal 203 side. In this case, the high-concentration carrier doped layer 202 serves as a cathode, and the Schottky metal 203 serves as an anode. Strip 204 serves as metal wiring on the cathode electrode side and strip 205 on a dielectric 22 serves as metal wiring on the anode electrode side in the same way as in the first embodiment. An opening 206, a void 207 and a dielectric pillar 208 are in the same way as in the first embodiment too.

The Schottky barrier diode 201 serves as a detecting device of an electromagnetic wave when antennae (not shown) or the like are provided outside of the Strips 204 and 205. The intrinsic delay of the detecting device is defined by a product of junction capacitance $C_j$ also including a delay time of carriers (electrons or holes) flying in the barrier layer in the low-concentration carrier doped layer and series resistance $R_s$ which cannot be removed in the Schottky barrier diode 201. In a frequency region from a millimeter waveband to a terahertz waveband, it is necessary to reduce the junction capacitance $C_j$ to the order of fF, and the junction area of the Schottky barrier diode 201 needs to be reduced. For example, in the case where the material for the Schottky barrier diode 201 is a Si-based material, the junction area thereof is to be in the order of 1 $\mu m^2$ or less. In the case where the material for the Schottky barrier diode 201 is a III-V based material such as GaAs having relatively high mobility, the junction area thereof is to be in the order of 10 $\mu m^2$ or less. As a result, in the processing technology with comparable accuracy, an overlapping region of about several $\mu m^2$ is formed between the strip 205 and the high-concentration carrier doped layer 202 serving as a cathode with conductivity. Under this circumstance, parasitic stray capacitance $C_s$ is generated in the detecting device in a frequency region from a millimeter waveband to a terahertz waveband, using the Schottky barrier diode 201. However, it is possible to reduce the stray capacitance $C_s$ in the vicinity of a side wall of the Schottky barrier diode 201 by the method shown in the first embodiment. In the second embodiment, a via hole 209 is further provided to enlarge the distance between the strip 205 and the high-concentration carrier doped layer 202 serving as a cathode. When the via hole 209 is designed to be high in a range in which the parasitic inductance of the via hole 209 is sufficiently small, the electric delay can be further reduced.

Third Embodiment

Figure 4A:
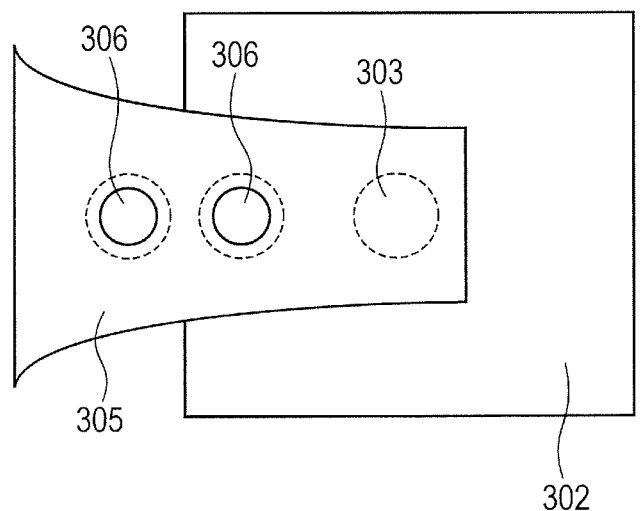
FIG. 4A is a view illustrating a configuration of a semiconductor device using a resonant tunneling diode according to a third embodiment of the present invention.
Figure 4B:
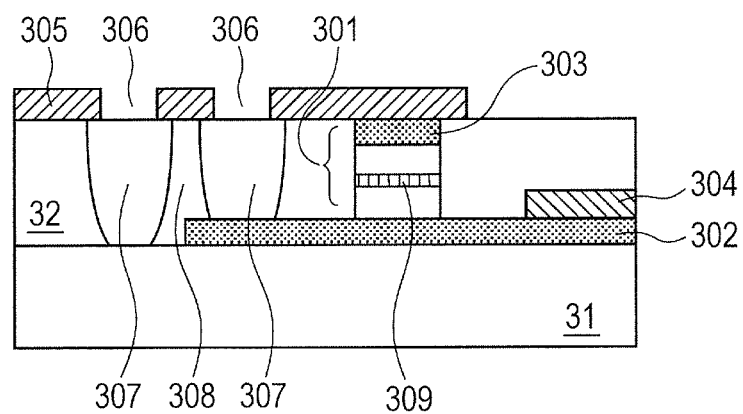
FIG. 4B is a view illustrating a configuration of the semiconductor device using the resonant tunneling diode according to the third embodiment of the present invention.

A semiconductor device according to a third embodiment of the present invention is described with reference to FIGS. 4A and 4B. FIGS. 4A and 4B are schematic views illustrating the semiconductor device according to the third embodiment. FIG. 4A is a top view, and FIG. 4B is a sectional view. The third embodiment is a modified example of the first embodiment, and a structure of a resonant tunneling diode (RTD) 301 is provided. For example, a high electron-concentration n+InGaAs layer 302, a resonant tunneling structure layer 309 in which InGaAs quantum wells and InAlAs potential barriers are repeated, and an n+InGaAs layer 303 are laminated on an InP substrate 31. Strip 304 serves as metal wiring on the collector electrode side and strip 305 on a dielectric 32 serves as metal wiring on the emitter electrode side in the same way as in the first embodiment. The void 307 is connected to an opening 306 of the wiring 305 in the same way as in the first embodiment too.

The resonant tunneling structure layer 309 has differential negative resistance in current-voltage characteristics as is well known and supplies an electromagnetic wave gain to serve as an oscillation device when a resonator is provided outside of the strip 304 and 305. In the same way as in the second embodiment, the intrinsic delay of the oscillation device is defined by a product of junction capacitance $C_j$ also including a delay time of electrons flying in the resonant tunneling structure layer 309 and series resistance $R_s$ which cannot be removed in the RTD 301. In a frequency region from a millimeter waveband to a terahertz waveband, it is necessary to reduce the junction capacitance $C_j$ to the order of fF, and an overlapping region of about several $\mu m^2$ is formed between the strip 305 and the high electron-concentration n+InGaAs layer 302 serving as a cathode with conductivity for the same reason as that of the second embodiment. Although parasitic stray capacitance $C_s$ is also generated in the oscillation device due to the overlapping region, it is possible to reduce the stray capacitance $C_s$ in the vicinity of a side wall of the RTD 301 by the method shown in the first embodiment.

Fourth Embodiment

Figure 5A:
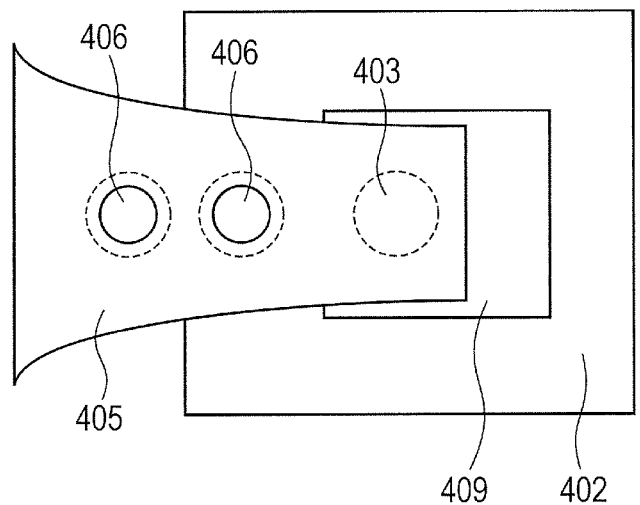
FIG. 5A is a view illustrating a configuration of a semiconductor device using a heterojunction bipolar transistor according to a fourth embodiment of the present invention.
Figure 5B:
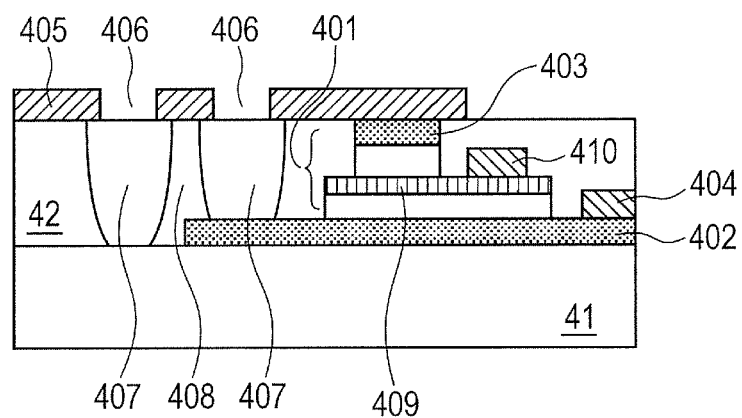
FIG. 5B is a view illustrating a configuration of the semiconductor device using the heterojunction bipolar transistor according to the fourth embodiment of the present invention.

A semiconductor device according to a fourth embodiment of the present invention is described with reference to FIGS. 5A and 5B. FIGS. 5A and 5B are schematic views illustrating the semiconductor device according to the fourth embodiment. FIG. 5A is a top view, and FIG. 5B is a sectional view. The fourth embodiment is a modified example of the first embodiment, and a structure of a heterojunction bipolar transistor (HBT) 401 is provided. For example, an n-type InP sub-collector 402, an InP collector, a p-type InGaAs base layer 409, an n-type InGaAs emitter, and an n+InGaAs layer 403 are laminated on an InP substrate 41. Strip 404 serves as metal wiring on the collector electrode side and strip 405 on a dielectric 42 serves as metal wiring on the emitter electrode side in the same way as in the first embodiment. The void 407 is connected to an opening 406 of the wiring 405 in the same way as in the first embodiment too.

The HBT 401 serves as a transistor device in which, when a small current is input from wiring 410 to the p-type InGaAs base layer 409, a large current flows between the n-type InGaAs emitter and the n-type InP sub-collector 402 and the current can be extracted from the wirings 404 and 405. In the same way as in the third embodiment, the intrinsic delay of the transistor device is defined by a product of collector-base capacitance $C_{c-b}$ also including a delay time of electrons flying in the p-type InGaAs base layer 409 and series resistance $R_s$ which cannot be removed. In a frequency region from a millimeter waveband to a terahertz waveband, it is necessary to reduce the collector-base capacitance $C_{c-b}$ to the order of fF, and an overlapping region of about several $\mu m^2$ is formed between the strip 405 and the n-type InP sub-collector 402 for the same reason as that of the second embodiment. Although not shown in FIG. 5B, the same applies to the wiring 410 and the n-type InP sub-collector 402. Although parasitic stray capacitance $C_s$ is also generated in the transistor device due to the overlapping region, it is possible to reduce the stray capacitance $C_s$ in the vicinity of a side wall of the HBT 401 by the method shown in the first embodiment.

According to those embodiments, a void is provided in a portion immediately below conductive strip in which there is a risk in that parasitic capacitance may be generated in a semiconductor device, and the void can be easily filled with air (or inactive gas or the like) having a specific permittivity of about 1. Therefore, the parasitic capacitance can be reduced without being limited by the material for a dielectric. The void and opening in strip can be designed in advance so that the mechanical strength of conductive strip is not impaired, and hence industrial mechanical strength can also be stabilized simultaneously. When such a semiconductor device is used, semiconductor elements in the above-mentioned frequency region can be easily integrated at a wafer level. Further, additional wiring layer on the device can also be performed by setting an opening to be sufficiently small, and hence multilayered wiring and large-scale integration at a wafer level can also be achieved.

Further specific semiconductor devices are described in the following examples.

Example 1

Figure 6A:
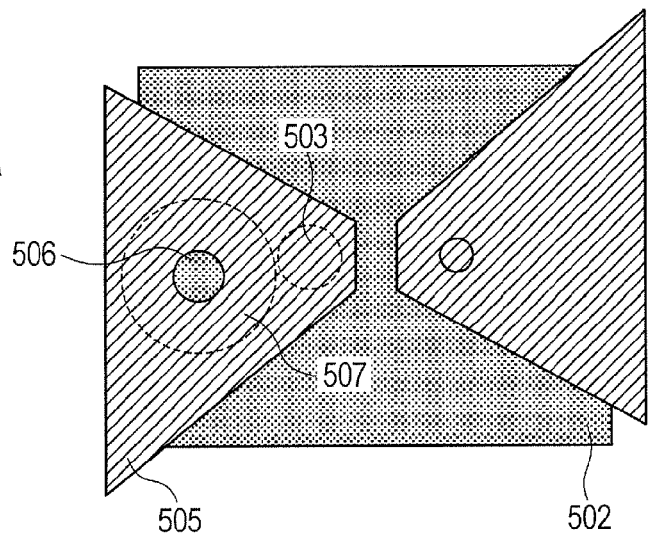
FIG. 6A is a view illustrating a configuration of a semiconductor device using a Schottky barrier diode according to Example 1 of the present invention.
Figure 6B:
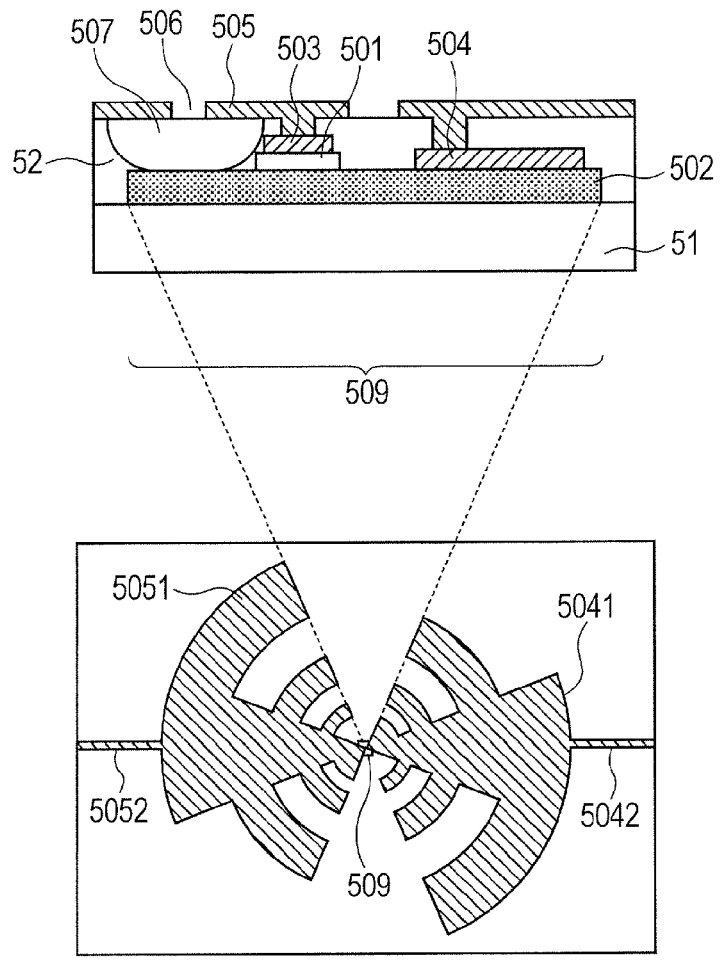
FIG. 6B is a view illustrating a configuration of the semiconductor device using the Schottky barrier diode according to Example 1 of the present invention.

A semiconductor element according to Example 1 is described with reference to FIGS. 6A and 6B. FIG. 6A is a top view illustrating part of a detecting device according to Example 1, and an upper view of FIG. 6B is a sectional view thereof. A lower view of FIG. 6B is a top view illustrating the entire detecting device provided with an antenna. Example 1 shows a detecting device using a Schottky barrier diode as a rectifying element.

In Example 1, a Si substrate is used as a substrate 51. Owing to the enhancement of a Float Zone (FZ) technology, a high-resistance product having a resistance of 1 kΩcm is used. Electrons are adopted as carriers. A high-concentration carrier layer 502 has an n-type carrier concentration of $5 \times 10^{19}$ cm$^{-3}$ and a thickness of 400 nm. A low-concentration carrier layer 501 has an n-type carrier concentration of $5 \times 10^{17}$ cm$^{-3}$ and a thickness of 100 nm. The low-concentration carrier layer 501 comes into contact with a Schottky electrode 503 to form a Schottky barrier on the Schottky electrode 503 side. An ohmic electrode 504 comes into contact with the high-concentration carrier layer 502 to form an ohmic barrier. In Example 1, titanium (Ti) is used as electrode materials for the Schottky electrode 503 and the ohmic electrode 504. The same electrode material forms Schottky contact or Ohmic contact depending on the property of a semiconductor with which the electrode material comes into contact. The thickness of the Schottky electrode 503 and the ohmic electrode 504 is 100 nm. However, the present invention is not limited thereto, and the thickness of the Schottky electrode 503 and the ohmic electrode 504 may be set to be smaller or larger than 100 nm. Thus, a Schottky barrier diode to which the present invention can be applied is configured.

For configuring the detecting device, an island 509 of the low-concentration carrier layer (semiconductor) 501 and the high-concentration carrier layer (semiconductor) 502 is formed. The size of the island 509 was set to about 50 $\mu m^2$ or less, with one side being about 7 $\mu m$, so as to detect an electromagnetic wave in a frequency band from 0.5 THz to 3 THz. Further, the island 509 is buried in a silicon nitride film 52 and connected to strip 505 of Ti/Al or the like through the Schottky electrode 503 and a contact hole having a height of 100 nm. Note that, the diameter of the Schottky electrode 503 was set to 0.6 µm, and the distance between the Schottky electrode 503 and the Ohmic electrode 504 was set to 1 µm so that a cut-off frequency of an intrinsic $R_sC_j$ low-pass filter in a diode structure was about 3 THz. The strip 505 is a metal pattern directly connected to an antenna 5051, and in Example 1, an opening 506 is provided in order to reduce the stray capacitance $C_s$ in this portion. The opening has a diameter of 0.3 µm, and an increase in resistance of the strip 505 of Ti/Al up to the antenna 5051 is sufficiently small. A void 507 connected to the opening 506 is provided in the silicon nitride film 52 immediately below the opening 506, and the void 507 was set to have a diameter of 2 µm so as to be adjacent to the diode structure. Thus, although the strip 505 immediately above the void 507 has a hollow structure, the amount of deflection caused by the own weight of the strip 505 is estimated to $2\times10^{-7}$ nm or less, and there is no risk in that the wiring 505 comes into contact with the high-concentration carrier layer 502. In the case of the structure of Example 1 in which the void 507 is directly filled with air, a stray capacitance difference which can be reduced may be substantially obtained by a parallel-plate capacitor equation: $(\in_{52}-1)\in_0 A/t$ ($\in_0$ represents a permittivity of a vacuum; A represents an area of a portion in the void 507 in which the strip 505 and the high-concentration carrier layer 502 are opposed to each other; t represents the distance between the strip 505 and the high-concentration carrier layer 502), and the stray capacitance difference which can be reduced was estimated to be $\delta C_s$=0.5 fF. Example 1 shows a result obtained by reducing the parasitic capacitance by 0.5 fF due to one void 507. Needless to say, the present invention is not limited thereto, and two or more voids may be provided as shown in the first and second embodiments, and the effect of reducing the parasitic capacitance may be enhanced by increasing the diameter of the void 507 in a range in which the mechanical strength is stable.

As an example of an integrated antenna, a log periodic antenna is used in Example 1 (lower view of FIG. 6B). Antennae 5041 and 5051 were each designed so as to have a radius up to an outer side of 250 µm, a radius up to an innermost side of 10 µm, nine comb teeth at a log period of 0.7, and an angle of the comb teeth of 45°. When such a structure was simulated by a high-frequency total electromagnetical field simulator HFSSv12 (manufactured by Ansoft Corporation), it was confirmed that an electromagnetic wave can be detected in a wide band from 0.2 THz to 2.5 THz. A detecting element is configured, which includes the above-mentioned diode structure and an antenna for inducing an electric field component of an electromagnetic wave to be detected between a Schottky electrode and an ohmic electrode and in which the Schottky electrode and the ohmic electrode are used as an output of the antenna. In this case, when the stray capacitance $C_s$ is reduced, the power transmission efficiency from the antenna to the diode in the above-mentioned frequency band is enhanced. Therefore, the structure of Example 1 is preferred as a detecting device including an integrated antenna.

For detecting, a detecting current is read by, for example, a current measurement unit (not shown) through read lines 5042 and 5052. In this case, an operating point voltage of a diode element may be set by applying a bias voltage to the read lines 5042 and 5052 by a voltage application unit (not shown). In the case of the diode element of Example 1, high sensitivity is obtained by setting a bias voltage in the vicinity of 0 V. The optimum bias voltage depends on the electrode material for the Schottky electrode 503. In the case of the structure of Example 1, a bias voltage in the vicinity of 0 V is optimum for an electrode material having a relatively low work function such as titanium (Ti), and a forward bias voltage in the vicinity of 0.3 V to 0.5 V is optimum for an electrode material having a relatively high work function such as platinum (Pt) and palladium (Pd).

The detecting element of Example 1 is produced as follows. First, epitaxial layers 502 and 501 are laminated on the Si substrate 51. For crystal growth, a chemical vapor deposition (CVD) method, a molecular beam epitaxy (MBE) method, or the like is applicable. After that, a plasma CVD oxide film is formed to a thickness of 100 nm. After the plasma CVD oxide film is grown, a resist is patterned so as to remain in a site corresponding to a region in which the island 509 is formed. The resist is formed in the site for forming the island 509 through general application, exposure, and development steps, and then the underlying plasma CVD oxide film is removed by etching through use of the resist as a mask. The plasma CVD oxide film can be removed easily by utilizing a reactive ion etching (RIE) device or the like and using etching gas such as mixed gas of $CF_4$ and $O_2$. Then, the resist is removed with an organic solvent. After that, the high-concentration carrier layer 502 and the low-concentration carrier layer 501 are etched with the patterned plasma CVD oxide film being used as a mask. Etching can be realized easily through use of dry etching with halogen-based gas such as $SF_6$ and $Cl_2$. In this case, it is preferred that etching be performed up to the substrate 51 in order to obtain electric insulation from the adjacent device. After that, the plasma CVD oxide film as a hard mask is removed by being soaked in buffered hydrofluoric acid or the like. The reasons for using the plasma CVD oxide film as a hard mask in the etching step of the island 509 are as follows: a selection ratio can be obtained easily compared to a process of etching through use of a resist as a mask; and the use of the plasma CVD oxide film as a hard mask is preferred to reduce the knock-on of the resist component with respect to the high-concentration carrier layer 502 and the low-concentration carrier layer 501. Then, completely in the same way as the above, a resist is patterned in a site corresponding to a region for forming the low-concentration carrier layer 501 after the growth of the plasma CVD oxide film, and the low-concentration carrier layer 501 is etched through use of the plasma CVD oxide film as a mask.

Then, the resist is patterned so that sites for forming the Schottky electrode 503 and the ohmic electrode 504 are removed. Thereafter, titanium (Ti) is formed as a film having a thickness of 100 nm by electron beam evaporation. Then, the resultant is soaked in an organic solvent to form the Schottky electrode 503 and the ohmic electrode 504 by a so-called lift-off method of removing the titanium (Ti) film in portions other than the sites for forming the Schottky electrode 503 and the ohmic electrode 504. The reason for using the lift-off method in the step of forming the electrodes is to prevent the introduction of defects caused by processing damage into the low-concentration carrier portion 501. Then, the plasma CVD nitride film to be the silicon nitride film (insulating film) 52 is formed. In the case where there is a possibility that the unevenness of the underlying island 509, the Schottky electrode 503 and the ohmic electrode 504 may be reflected onto the plasma CVD nitride film, and insufficient focus depth or the like may be caused during patterning of a log periodic antenna described later, the following may be performed. That is, the plasma CVD nitride film can also be flattened through use of a chemical mechanical polishing (CMP) step after the island 509 is buried in the plasma CVD nitride film. After that, a resist is patterned so that the portions on the Schottky electrode 503 and the ohmic electrode 504 are removed, and through-hole etching is performed. The above-mentioned RIE or the like is applicable to the through-hole etching, and $CF_4$ or the like is applicable to the gas. After the removal of the resist, Ti/Al is formed continuously as films respectively having thicknesses of 10 nm and 200 nm by a sputtering method. After the Ti/Al films are formed, a resist is patterned so as to form the log periodic antennae 5041 and 5051, and unnecessary portions of the Ti/Al films are removed with halogen-based gas through use of the RIE device or an electron cyclotron resonance (ECR) etching device having a higher plasma density.

Finally, a production method for the void 507 is described. First, a resist pattern is formed so that a site for forming the opening 506 is removed. Then, the Ti/Al (=10/200 nm) of the strip 505 is removed by etching with an inductive coupled plasma (ICP)-reactive ion etching (RIE) method using chlorine gas with the resist pattern being used as a mask, with the result that the opening 506 having a diameter of 0.3 μm is formed. Next, the silicon nitride film 52 (thickness: 300 nm) serving as an insulating film exposed to the opening 506 is etched isotropically to form a beam of the strip 505 and the void 507, with the resist pattern and the strip 505 being used as a mask. When gas etching such as chemical dry etching using down-flow plasma is used as the isotropic etching in this case, problems of the diffusion of reactive species and sticking are prevented. Therefore, the void 507 can be formed with good yield in a wider region. In this case, it is preferred to use gas in which a small amount of $H_2$ or $H_2O$ is added to mixed gas of $CF_4$ and $O_2$ because a selection ratio between the nitride film and the silicon of the high-concentration carrier layer 502 is obtained. Finally, the resist mask is removed by asking to complete the semiconductor element of Example 1.

Figure 7A:
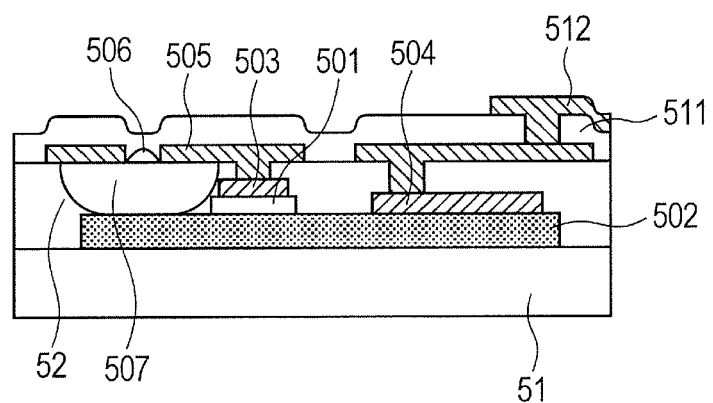
FIG. 7A is a view illustrating a configuration of a semiconductor device according to a modified example of Example 1 of the present invention.

Further, in the case where the opening 506 is relatively small as a modified example of Example 1, a new layer can be laminated on the strip 505. FIG. 7A illustrates an exemplary structure thereof. In the case of forming an insulating film 511 by sputtering or plasma CVD, when the thickness of a film to be formed (layer thickness) is larger than the diameter of the opening 506, the insulating film 511 can be laminated on the strip 505 substantially without depositing the insulating film 511 on the void 507. For this reason, it is preferred that the diameter of the opening 506 in this embodiment be 1 μm or less. It is preferred that the insulating film 511 be a sputter oxide film, a plasma oxide film, a sputter nitride film, or a plasma nitride film. Thus, wiring 512 for electric connection at an inter-element level can also be arranged on the insulating film 511. When such a semiconductor device is used, semiconductor elements in the above-mentioned frequency region can be more easily integrated at a wafer level.

Figure 7B:
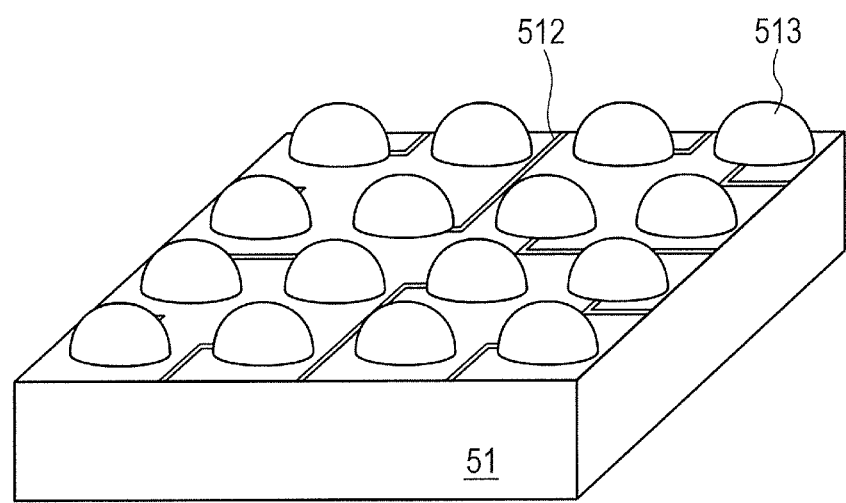
FIG. 7B is a view illustrating a configuration of the semiconductor device according to the modified example of Example 1 of the present invention.

Further, by arranging multiple detecting elements in an array, an image forming apparatus can be configured, which includes an image forming part for forming an image of an electric field distribution based on an electric field of an electromagnetic wave to be detected by each of the multiple detecting elements. FIG. 7B illustrates an exemplary structure thereof. In this example, a microlens array 513 is used as respective pixels, and a detecting signal of each pixel can be extracted through wiring 512. In this case, it is expected that this structure is also excellent in yield of an array which is an assembly of mechanically stable detecting elements. This structure is also preferred as an image forming apparatus because the variation in parasitic capacitance in the respective pixels is very small and the image correction for correcting the parasitic capacitance can be made at a minor level.

Example 2

Figure 8A:
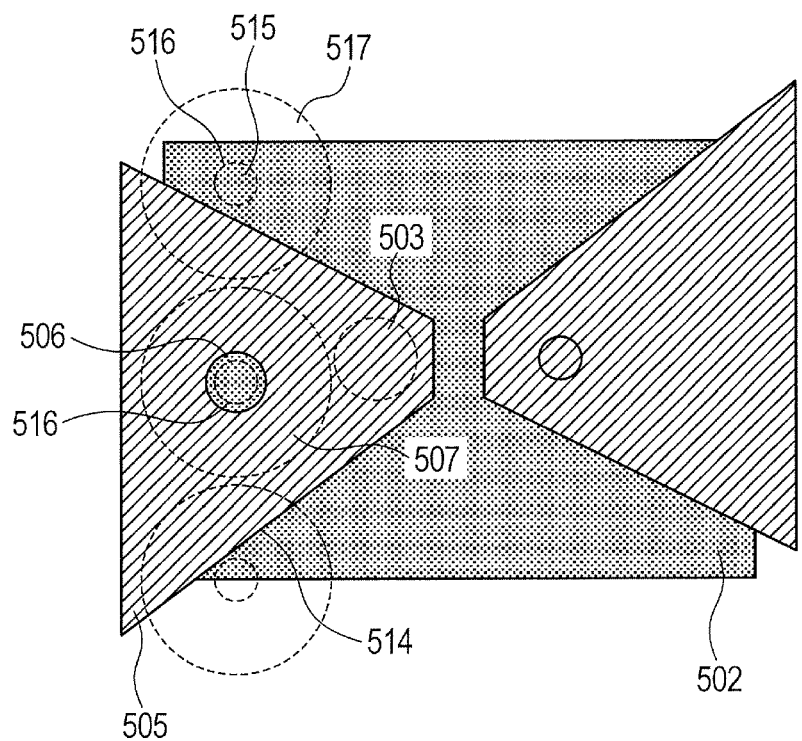
FIG. 8A is a view illustrating a configuration of a semiconductor device using a Schottky barrier diode according to Example 2 of the present invention.
Figure 8B:
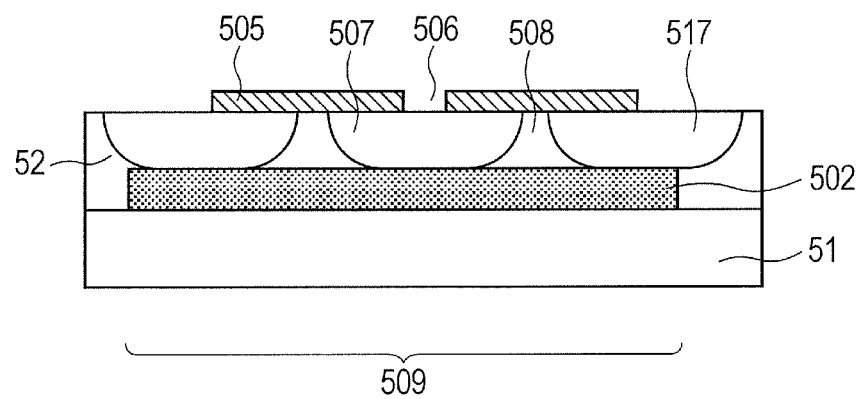
FIG. 8B is a view illustrating a configuration of a semiconductor device using the Schottky barrier diode according to Example 2 of the present invention.

A modified example of Example 1 using a different production method is described with reference to FIGS. 8A and 8B. FIG. 8A is a top view illustrating part of a detecting device according to Example 2, and FIG. 8B is a sectional view thereof.

Example 2 is different from Example 1 in that a void 517 which is not arranged immediately below the strip 505 is provided. By providing the void 517 also at a position different from that of the void 507 connected to the void 506 of the strip 505, the parasitic capacitance caused by an electric line of force concentrated in the vicinity of an edge 514 of the strip 505 can also be reduced. For this purpose, an opening 516 of a resist pattern is prepared with respect to a position 515 outside of the strip 505 to form the void 517. Along with this, a method different from that of Example 1 is used in the production method in Example 2.

First, up to the step of burying the island 509 and the like in the silicon nitride film (dielectric) 52 on the substrate 51, the same production method as that of Example 1 is used. After that, during the formation of the strip 505, a resist is patterned so that a site for forming the opening 506 is removed. The resist is patterned so that the antennae 5041 and 5051 are formed in the same way as in Example 1, and unnecessary portions of Ti/Al are removed with halogen-based gas. In the case of Example 2, one opening 506 having a diameter of 0.3 μm is formed in the strip 505. Then, a resist is patterned for the opening 516 of the resist pattern having a diameter of 0.2 μm. In the case of Example 2, one opening 516 of the resist pattern is formed on the opening 506 of the strip 505, and two openings 516 of the resist pattern are formed outside of the edges 514 of the strip 505. At this time, the silicon nitride film 52 serving as an insulating film exposed to the opening 516 of the resist pattern is etched isotropically to form a beam of the strip 505, the voids 507 and 517. The resist is removed, and hence the opening 516 of the resist pattern is eliminated finally from the structure. However, the center of the void 517 is matched with a center 515 of the opening 516 of the resist pattern, and hence it is understood that the structure is produced through the above-mentioned production method. When such a semiconductor device is used, a semiconductor device with the parasitic capacitance reduced further can be provided.

Thus, according to those embodiments, in a semiconductor device compatible with a frequency region from a millimeter waveband to a terahertz waveband, the mechanical strength can be stabilized while the parasitic capacitance is reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2012-257596, filed Nov. 26, 2012, and No. 2013-212391 filed Oct. 9, 2013 are hereby incorporated by reference herein in their entirety.

What is claimed is:

1. A semiconductor device, comprising:
   a semiconductor element arranged on a substrate and having two electrodes;
   a conductive strip in contact with one of the two electrodes; and
   a dielectric arranged between another one of the two electrodes and the conductive strip,
   wherein:
   the conductive strip has an opening formed therein;
   the dielectric has a void formed therein; and
   the opening and the void are connected to each other.

2. The semiconductor device according to claim 1, wherein the void has an area larger than an area of the opening.

3. The semiconductor device according to claim 1, wherein the void has a size larger than a size of the opening.

4. The semiconductor device according to claim 1, wherein the conductive strip overhangs the void.

5. The semiconductor device according to claim 1, further comprising a layer arranged on the conductive strip,
wherein the opening has a diameter smaller than a thickness of the layer.

6. The semiconductor device according to claim 1, wherein the opening has a size of 1 µm or less.

7. The semiconductor device according to claim 1, wherein the semiconductor element comprises a Schottky barrier diode.

8. The semiconductor device according to claim 1, wherein the semiconductor element comprises a resonant tunneling diode.

9. The semiconductor device according to claim 1, wherein the semiconductor element comprises a heterojunction bipolar transistor.

10. An image forming apparatus, comprising:
multiple detecting elements arranged in an array; and
an image forming part for forming an image of an electric field distribution based on a detection result of the multiple detecting elements,
wherein the multiple detecting elements each comprising the semiconductor device according to claim 1.

11. A production method for the semiconductor device according to claim 1, comprising forming the void by introducing an etching gas through the opening of the conductive strip to remove the dielectric.

12. The production method for the semiconductor device according to claim 11, further comprising exposing the dielectric by forming the opening of the conductive strip.

13. The production method for the semiconductor device according to claim 11, further comprising:
applying a resist onto the conductive strip and the dielectric outside of the conductive strip;
exposing the dielectric outside of the conductive strip by forming an opening in the resist; and
forming the void by introducing an etching gas through the opening of the resist to remove the dielectric.

* * * * *